(12) United States Patent
Phan et al.

(10) Patent No.: US 6,305,000 B1
(45) Date of Patent: Oct. 16, 2001

(54) PLACEMENT OF CONDUCTIVE STRIPES IN ELECTRONIC CIRCUITS TO SATISFY METAL DENSITY REQUIREMENTS

(75) Inventors: Nghia Van Phan; Michael James Rohn, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/334,171

(22) Filed: Jun. 15, 1999

(51) Int. Cl.[7] ........................................... G06F 17/50
(52) U.S. Cl. ................................................. 716/5; 438/18
(58) Field of Search .................................. 361/761, 764; 716/5; 438/18

(56) References Cited

U.S. PATENT DOCUMENTS

| | | | |
|---|---|---|---|
| 4,721,689 | 1/1988 | Chaloux, Jr. et al. | 437/189 |
| 5,272,600 | 12/1993 | Carey | 361/792 |
| 5,296,189 | 3/1994 | Kang et al. | 419/9 |
| 5,574,630 | 11/1996 | Kresge et al. | 361/792 |
| 5,602,423 | 2/1997 | Jain | 257/752 |
| 5,654,216 | 8/1997 | Adrian | 438/627 |
| 5,712,207 | 1/1998 | Lee et al. | 438/627 |
| 5,741,557 | 4/1998 | Corbin et al. | 427/469 |
| 5,846,854 | 12/1998 | Giraud et al. | 438/149 |
| 5,846,874 | 12/1998 | Hartranft et al. | 438/598 |
| 5,872,018 | * 2/1999 | Lee | 438/18 |
| 6,075,711 | * 6/2000 | Brown et al. | 361/761 |

* cited by examiner

Primary Examiner—David Nelms
Assistant Examiner—Thong Le
(74) Attorney, Agent, or Firm—Karuna Ojanen; James R. Nock

(57) ABSTRACT

An electronic circuit and a method of designing the electronic circuit having conductive fill stripes which are electrically attached to the power distribution or to the signal routing of the circuit. Preferably, the conductive fill stripes are electrically attached to the power distribution and are interspersed between the power buses and signal wires on the various metal layers to satisfy the metal density requirements of integrated circuit and chip manufacturing. The conductive fill stripes are added during the design process after the placement of the power distribution and signal routing so that electrical continuity between the conductive fill stripes and the connecting bus, metal density requirements, other design rules and logic verification can be completed as the rest of the chip is designed.

15 Claims, 16 Drawing Sheets

US 6,305,000 B1

PLACEMENT OF CONDUCTIVE STRIPES IN ELECTRONIC CIRCUITS TO SATISFY METAL DENSITY REQUIREMENTS

TECHNICAL FIELD

This invention relates generally to the design and manufacture of electronic circuits and more particularly relates to the addition of conductive fill stripes to satisfy metal density requirements and improve circuit performance.

BACKGROUND OF THE INVENTION

Electronic circuits comprise layers of semiconductor materials doped with specific elements or combination of elements to make them more or less conductive. It is the predictable and controlled movement of electrons or holes through these semiconductor materials that enable logic to be manipulated in transistors and other integrated devices. Ultimately, electronic circuits in microprocessors and computers are nothing more than multitudes of these integrated logic and storage devices interconnected with each other. These integrated devices are interconnected in electronic circuits with each other using metal layers in horizontal planes above the integrated devices. These metal layers, up to eight or more, are referred to M1, M2, M3, etc. have signal routing and power distribution on them. These metal layers are not necessarily identical to each other. Throughout the metal layers, there is a combination of conductors in which the power distribution supplies bias voltages and ground paths to the integrated devices whereas signal routing supplies signals generated by the devices and transferred to other devices. These power and signal conductors have a minimum spacing which when combined with the minimum allowable conductor width is known as wiring pitch.

Typically integrated devices and electronic circuits are created on the computer using a design space which is nothing more than the set of possible designs and design parameters that meet a specific product requirement. Exploring design space means evaluating the various design options possible with a given technology and optimizing with respect to specific constraints such as power or cost. For a particular semiconductor process technology, such as 0.5 micron CMOS, there are corresponding design rules that state the allowable limits for feature size, feature separation, layer-to-layer overlap, layer-to-layer feature separation, etc. used in the design and layout of integrated circuits. After an integrated circuit has been designed, the design is checked for compliance with the constraints imposed by these design rules, usually by a computerized design rule checker (DRC).

Silicon technology and integrated circuits have evolved to a point where the geometry of transistors and wires are so small with an increase in corresponding circuit density that it is becoming increasingly difficult to manufacture silicon chips with good yield and tolerances. Copper technology is especially sensitive to manufacturing process variations because of its smaller size. The design rules of manufacturers require that all wiring levels on these electronic circuits have a minimum usage requirement, i.e., a minimum density of metal per area, across all portions of the circuit to achieve consistent metal distribution across a wafer to improve manufacturing yield and reliability. For instance, one of these design rules for silicon technology require that all metal levels from M1 to M5 have a minimum density requirement of twenty percent or larger per area of one hundred square microns. The minimum density requirement for the thicker metal levels are ten percent or larger per one hundred square microns area.

FIG. 1 is a layout of conductors, also called buses, of two metal layers of an electronic circuit 10. Metal layer M2 has power distribution and signal routing in which the power distribution comprise ground conductors 210a and 210b, bias voltage conductor 230a, and signal routing 270a, 270b, . . . 270f . . . 270z. Another metal layer M3 lies in a plane above the first metal layer M2 with conductors running perpendicularly to those conductors in metal layer M2. Metal layer M3 shows power distribution comprising ground conductors 310a and 310b and a bias voltage conductor 330a. There may or may not be an intermediate metal layer between metal layers M2 and M3 but it is not shown in FIG. 1. The layout of the power distribution and signal routing of the electronic circuit 10 of FIG. 1 is considered ideal because the ground conductors are equally spaced from the bias voltage conductors and because the signal routing is equally spaced and uniformly interspersed among the power distribution. The conductors of the power distribution are ideally the same size, as are the signal routing albeit a different size than the ground and voltage conductors. When bias voltages are applied to the conductors and when signals are routed through the signal routing, the power and resultant heating will be equally dissipated over the area of the electronic circuit 10 of FIG. 1.

FIG. 2 illustrates a more realistic electronic circuit 20 having two metal layers M2 and M3 positioned one above the other with the power distribution and signal routing as shown in FIG. 1 with the exception that there are fewer signal conductors in metal layer M2. In the M2 layer of FIG. 2, there are only three signal conductors 270c, 270f, and 270z. As can be seen in FIG. 2, there are empty regions 11, 13, 15, 17, and 19 between the power distribution conductors of both the M2 and M3 layers and the signal routing 270c, 270f, and 270z. These empty regions 11, 13, 15, 17, and 19 violate the minimum area usage requirement for metal, especially in sensitive copper technologies as mentioned.

In the electronic circuit 20 of FIG. 2, the design rules and the manufacturing processes require that the empty regions 11, 13, 15, 17, and 19 be filled with metal or other conductors to satisfy a particular minimum usage requirement. In actuality, however, meeting the design rules is not as easy as placing conductors at regular intervals in a metal layer as shown in FIG. 1. Some logic or storage devices are busier than others, some devices require larger operating bias voltages, etc. Thus, in real life, some areas of the electronic circuit are more dense and consume more power and/or generate more signals than other areas of the electronic circuit. These variations of use and power must be considered when meeting minimum usage requirements.

One technique used to fill the areas is the "sprinkle" fill approach undertaken after the chip has been designed but before it is manufactured. The sprinkle fill approach does in fact satisfy the design rules check for minimum area of metal usage but it has several shortcomings. FIG. 3 illustrates the layout of two metal layers M2 and M3 of FIG. 2 but empty regions 11, 13, 15, 17, and 19 and other empty regions have been filled with small floating metal conductors labeled 240a, 240b, 240c . . . 240q in the M2 layer using the sprinkle fill approach. One of the most serious shortcomings is that these metal fills are floating, i.e., they are not electrically connected to either the power distribution or the signal routing. Unexpected line-to-line coupling and vertical coupling between metal planes result from the use of the floating metal fills and causes unpredictable electrical and performance problems. Another problem is that the metal fills 240a . . . 240q are added after the chip design is completed and so are not considered during the normal design process. As any skilled circuit designer is aware, late changes to a design causes problems, such as accidental shorts between signals, and complicates the design and may cause delays if necessary to redesign circuits to correct problems created by the late insertion of these floating metal fills. Yet, another problem is that a large number of spaces have to be filled necessarily increasing the data volume making full chip logical to physical verification (Layout vs. Schematic—LVS) nearly impossible. Because of the checking problems with DRC and comparison of the actual layout of the chip against the schematic transistor design of circuit and interconnections (LVS), many of these electrical problems may not be found before manufacture.

Another such approach to meeting the minimum usage area requirements is given in U.S. Pat. No. 5,272,600 entitled Electrical Interconnect Device with Interwoven Power and Ground Lines and Capacitive Vias to Carey which use capacitive vias in otherwise undedicated areas between overlapping power and ground lines of the various levels to avoid additional conductors.

Thus, there is a need for a electronic circuit design tool to insert fill conductors into a design of an electronic circuit so that the circuit can meet the minimum usage requirement. The placement of the fill conductors must be included early enough in the design of the electronic circuits to undergo DRC/LVS checks and verification. Moreover, there is a need in the industry for the placement of fill conductors in the power distribution and signal routing of integrated circuits. The performance of these fill conductors must be electrically predictable to avoid unanticipated coupling and/or electrical shorting.

These and other objects, features and advantages of the present invention will be further described and more readily apparent from the summary, detailed description and preferred embodiments, the drawing and the claims which follow.

SUMMARY OF THE INVENTION

This invention provides a robust solution to satisfying metal density requirements during the design of an electronic circuit. An electronic circuit according to one embodiment of the invention comprises a plurality of integrated circuits on a wafer with a plurality of metal conductive layers each having a distribution network of power and signal conductors with empty areas there between, the plurality of metal conductive layers being electrically connected to the integrated circuits. A plurality of conductive fill stripes are placed in the design of the electronic circuit in the empty areas to meet metal density requirements of the electronic circuit. The conductive fill stripes are electrically connected to the distribution network. It is envisioned that the power distribution, the signal conductors, and the conductive fill stripes could be of copper, titanium, aluminum, gold, tungsten, or any alloy thereof.

The conductive fill stripes are preferably positioned between the signal conductors and the power distribution on the same metal conductive layer. The power distribution may further comprise a ground power bus and a bias voltage bus wherein at least one of the conductive fill stripes is electrically connected to a ground power bus or a bias voltage bus on an adjacent metal conductive layer. When the conductive fill stripes are situated on a intermediate metal layer, the ground fill stripe may be electrically connected to a ground power bus on the same as or different metal conductive layer than the bias voltage bus to which a bias voltage fill stripe on the intermediate metal layer is electrically connected. Some of the conductive fill stripes may be electrically connected to signal routing on an adjacent metal conductive layer.

Another embodiment of the invention can be considered an electronic circuit having a plurality of integrated circuits on a wafer, a plurality of metal conductive layers one above another with the conductive layers being electrically connected to the integrated circuits and to each other. Each of the metal conductive layers have a distribution network of ground power buses and bias voltage power buses and signal routing. In the design, there exist empty areas between the distribution network and the signals conductors wherein a plurality of conductive fill stripes can be placed to satisfy metal density requirements of the electronic circuit. The conductive fill stripes may be at least one ground fill stripe parallel to and coextensive with the distribution network of its own metal conductive layer and electrically connected to a ground power bus on a first adjacent metal conductive layer. The conductive fill stripe may also be at least one bias voltage fill stripe parallel to and coextensive with the distribution network of its own metal conductive layer and electrically connected to a bias voltage power bus on a second adjacent metal conductive layer.

In the design of electronic circuits, a method is disclosed which comprises the steps of defining power distribution, external IO signal routing, acceptable circuit placements and internal signal routing of the design. Circuits and interconnections between the circuits are placed on the design and a map of the power distribution and the external and internal signal routing is added onto the design. Conductive fill striping is added to portions of the map of the design which do not satisfy metal density requirements. The maximum amount of conductive fill striping to can be added to those portions, or conductive fill striping may be added to portions of the only if a distance to the power distribution or the signal routing is greater than or equal to a specified spacing variable of a design rule. Then the conductive fill striping is connected to the power distribution in the design and those conductive fill striping cannot be electrically connected to said power distribution are deleted from the design. A design rule checker is run to determine if the design satisfies design rules and meets metal density requirements. If not, more conductive fill stripes are added to the design and the process is repeated until the design meets the metal density requirements. The logical function of the design is verified against an electrical schematic of the design and the method determines that the conductive fill striping can be electrically connected to said power distribution in the design.

In an alternative embodiment, the method to design electronic circuits may comprise the steps of defining power distribution, external IO signal routing, acceptable circuit placements and internal signal routing of the design. Preferred locations in the design for the placement of conductive fill striping based on power distribution and signal strength and switching speed of signal routing are predefined in the process. The circuits and a plurality of interconnections between said circuits are placed on the design. The conductive fill striping is added in the design to those predefined preferred locations lacking signal routing and are connected to the power distribution. The conductive fill striping that cannot be electrically connected to the power distribution is deleted and a design rule checker is run to determine if said design satisfies design rules. If not preferred locations are redefined and conductive fill striping is including in the design in those locations and the process repeats. If, however, the design meets the metal density

DETAILED DESCRIPTION OF THE INVENTION

Figure 4:
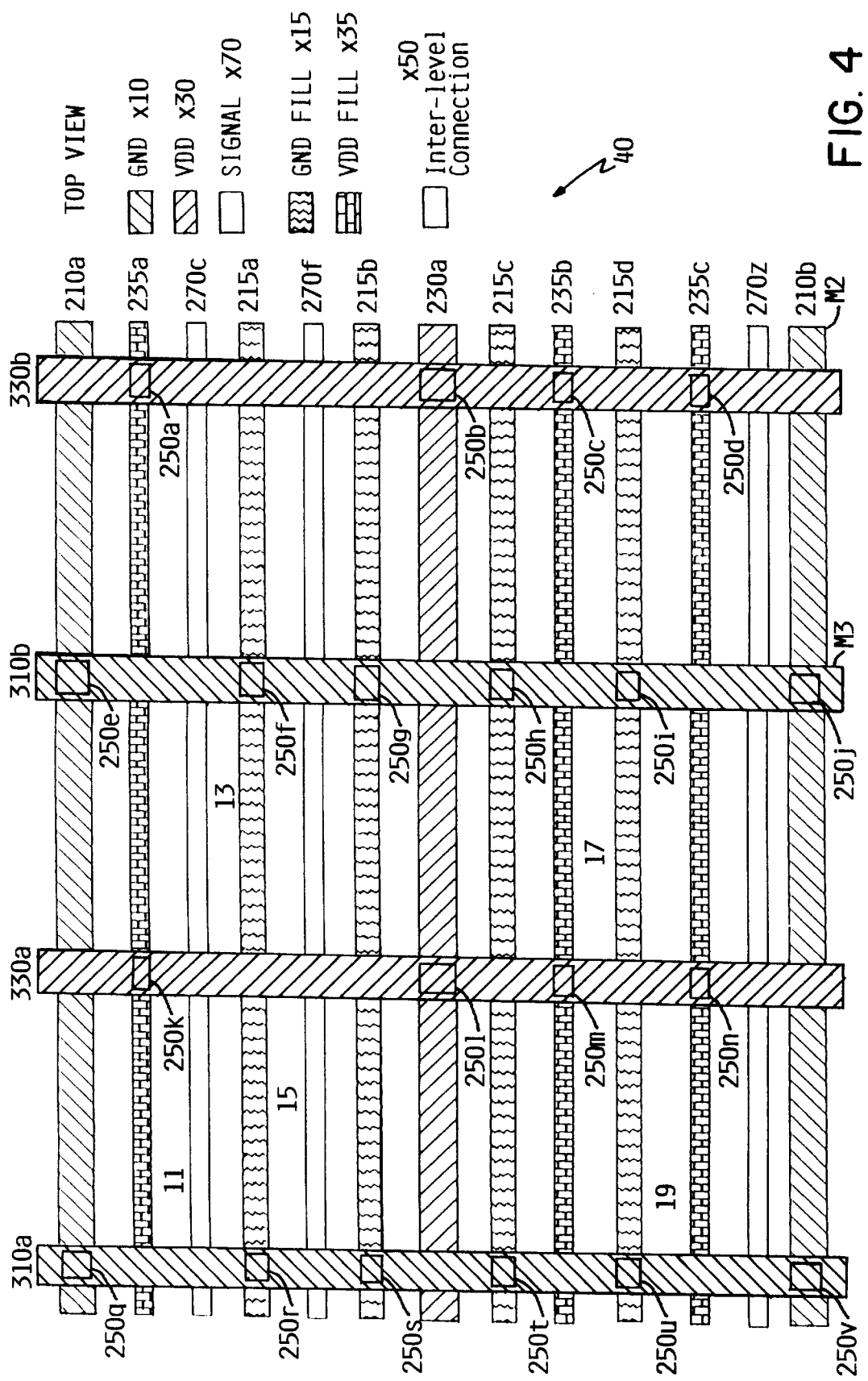
FIG. 4 is an illustration of the placement of conductive striping in an electronic circuit in accordance with an embodiment of the invention. It is recommended that FIG. 4 be printed on the face of the patent.

Referring now to FIG. 4 and the remainder of the drawings wherein depicted elements are not necessarily shown to scale and wherein like or similar elements are designated by the same reference numeral throughout the several views and, more particularly to FIG. 4, which shows an embodiment of the invention to provide a more useful and robust approach to satisfy the integrated chip's metal area usage requirements by filling the unused area with conductive fill striping.

Figure 1:
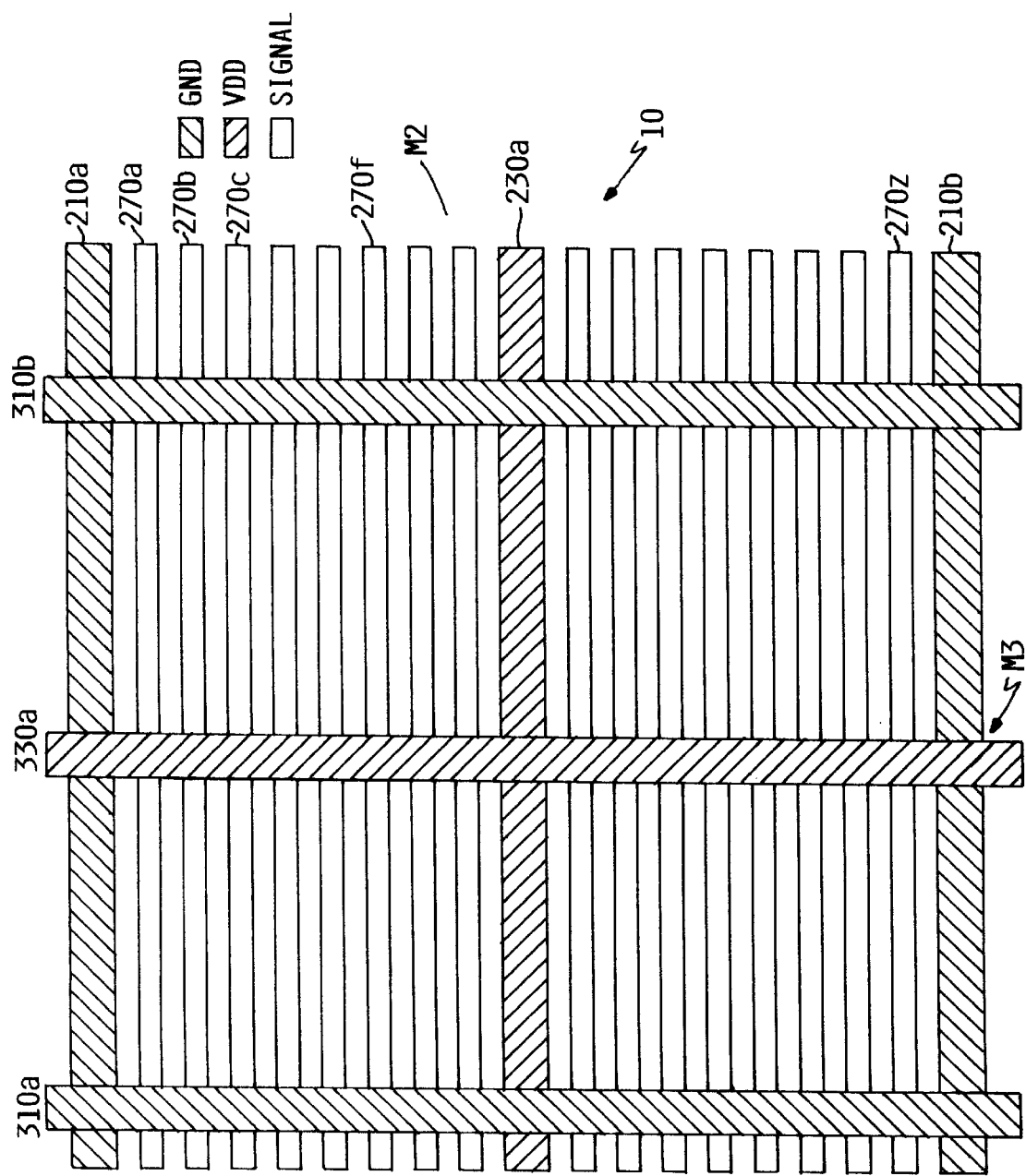
FIG. 1 is an illustration of a layout of power and signal conductors of two metal layers in an ideal electronic circuit.
Figure 2:
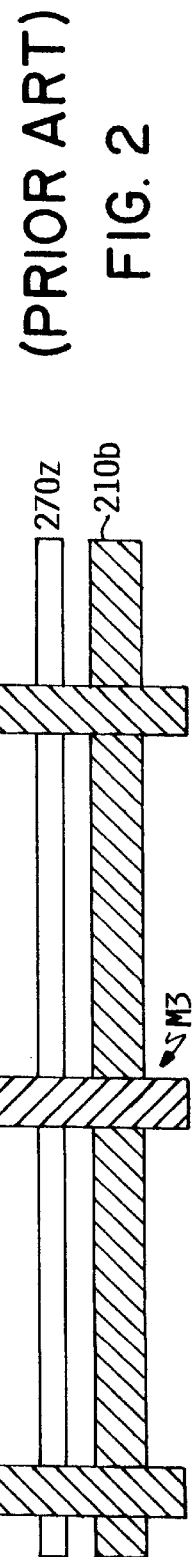
FIG. 2 is an illustration of a layout of power and signal conductors of two metal layers in a prior art electronic circuit.

FIG. 4 has the same basic layout of metal layers M3 above metal layer M2 with both layers having power distribution and signal routing as in FIG. 2. Metal layer M3 has ground buses 310a and 310b and bias voltage buses 330a and 330b. Metal layer M2 has, from the top of the figure to bottom, a ground bus 210a, a bias voltage conductor fill stripe 235a (VDD FILL), a signal conductor 270c, a ground conductor fill stripe 215a (GND FILL), a second signal conductor 270f, a second GND FILL 215b, a bias voltage bus 230a, a third GND FILL 215c, another VDD FILL 235b, a fourth GND FILL 215d, another VDD FILL 235c, a signal conductor 270z, and a ground bus 210b. This particular layout is somewhat arbitrary and should be considered as illustrative only; the particular layout is not intended to be limiting in any fashion. There may be more or less GND FILL conductor stripes than VDD FILL conductor stripes in a metal layer. Metal layer M3 is shown in FIG. 4 without any conductor fill stripes but in actuality, M3 may also have a number of conductor fill stripes. Moreover, the spacing and arrangement of the conductor fill stripes is also somewhat arbitrary in FIG. 4 meaning that two or more VDD FILL conductor stripes may be adjacent to each other or two or more GND FILL conductor stripes may be adjacent each other. The pattern of buses, signal conductors, and conductor fill stripes must be determined based on the individual applications and circuit parameters. Conductive fill stripes are not necessarily symmetric with respect to any ground or power bus and although there is a tendency to alternate GND FILL and VDD FILL conductor stripes, it need not be so. The conductive fill stripes may also be connected to signal routes, but it is preferred that the conductive fill strips be electrically connected to the power distribution. The conductive fill stripes 215a, 215b, 215c, 215d and 235a, 235b, and 235c fill the empty spaces 11, 13, 15, 17, and 19 and other unlabeled open spaces to meet minimum conductor density requirements.

The conductive fill stripes are preferably parallel to and coextensive with, i.e., the conductive fill stripes extend uninterrupted along the longer dimension, existing power buses in its own metal layer and perpendicular to power buses and signal routing in metal layers above or below and are electrically connected to them to enhance both layers. As seen in FIG. 4, whenever a bias voltage or ground conductor of one metal layer crosses a GND FILL or VDD FILL of another metal layer, those conductors are electrically connected to enhance the power grid structure of the chip. These electrical connections can be made with vias or with conductive metal, as is known in the art. FIG. 4 illustrates the interlevel connections 250a, 250b 250c . . . 250v which electrically connect a conductive fill stripe with its corresponding power bus.

Figure 5:
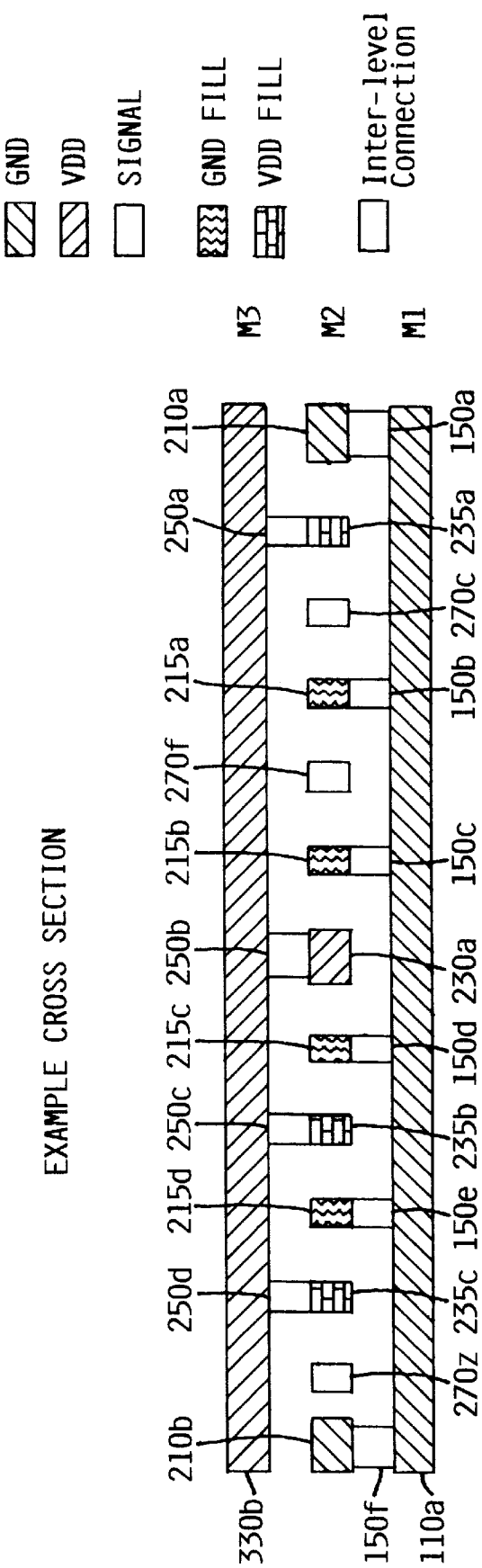
FIG. 5 is a vertical cross-section of the right edge of the electronic circuit of FIG. 4.

FIG. 5 is a vertical cross-section of the electronic circuit 40 from its right edge as shown in FIG. 4. FIG. 5 shows three metal layers M1, M2, and M3 each above the other. Layers M2 and M3 are the same layers as in FIG. 4, but metal layer M1 is not visible in FIG. 4 because its view is blocked by metal layer M3. In FIG. 5, metal layer M1 has a ground power bus 110a under the bias voltage bus 330b. Conductive bias voltage fill stripes VDD FILL 235a, 235b, and 235c are electrically connected through interlevel connections 250a, 250c, and 250d, respectively, to perpendicular bias voltage bus 330b of metal layer M3. Conductive ground fill stripes GND FILL 215a, 215b, 215c, and 215d are electrically connected through interlevel connections 150b, 150c, 150d, and 150e to perpendicular ground power bus 110a in metal layer M1. Interlevel connections are also provided for electrically connecting the power bus on one level with its corresponding power bus on another layer. In the example provided for in FIG. 5, ground power buses 210a and 210b on metal layer M2 are electrically connected through interlevel connection 150a and 150f, respectively, to ground power bus 110a on metal layer M1. Similarly, bias voltage power bus 330b on metal layer M3 is electrically connected to bias voltage bus 230a on metal layer M2 at interlevel connection 250b.

Figure 3:
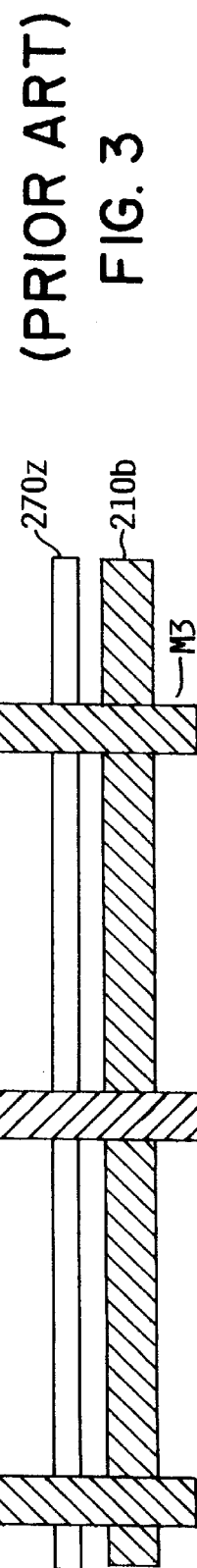
FIG. 3 is an illustration of the placement of metal conductors sprinkled into spaces between power and signal conductors in a prior art electronic circuit of FIG. 2.
Figure 6A:
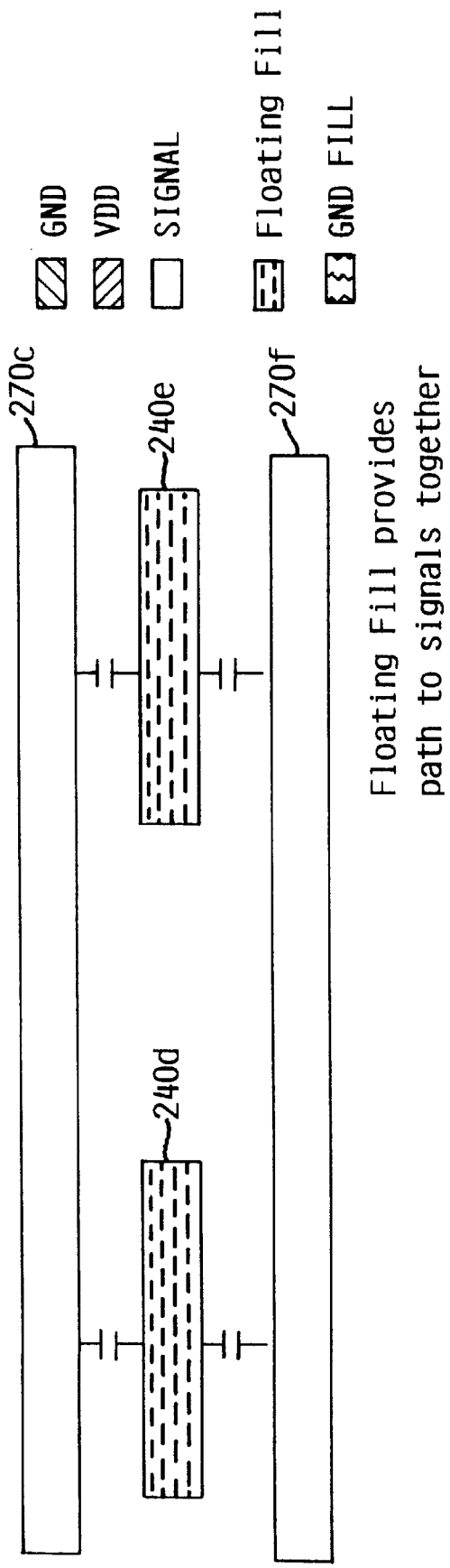
FIGS. 6a and 6b illustrate capacitive coupling between conductors in the same plane of the prior art electronic circuit sprinkled with metal fill, and of the electronic circuit using conductive striping in accordance with an embodiment of the invention, respectively.
Figure 6B:
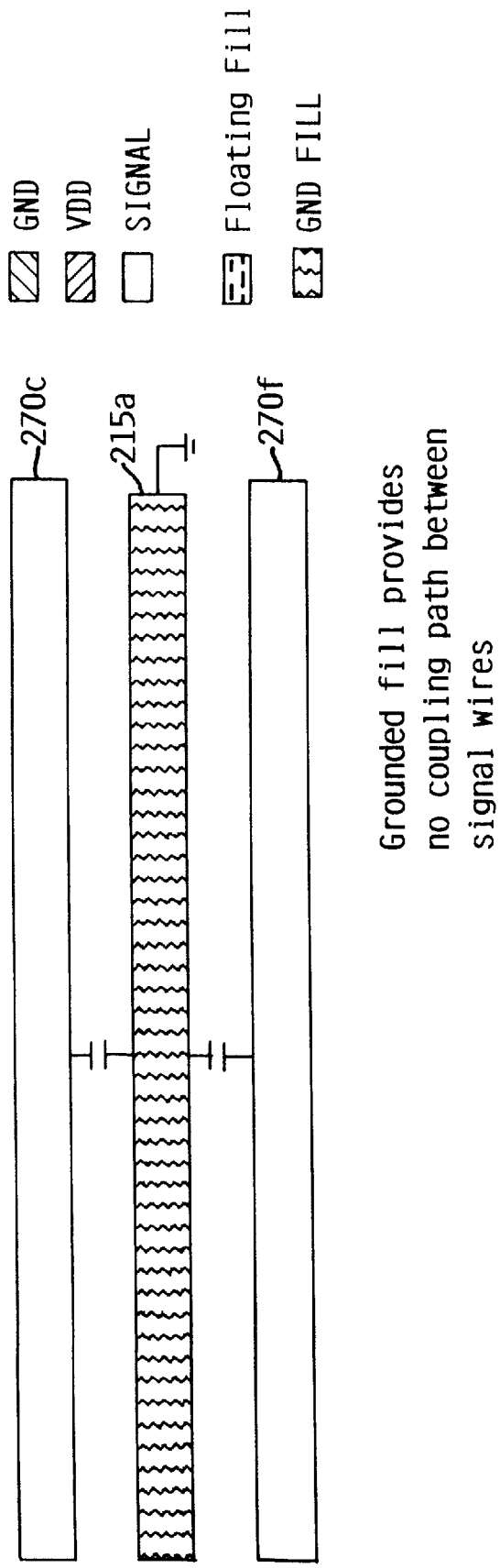

FIGS. 6a and 6b are illustrations of coplanar capacitive coupling in the prior art using the floating metal fill as shown in FIG. 3 contrasted with using conductive fill stripe 215a in accordance with one embodiment of the invention as shown in FIG. 4. FIG. 6a illustrates floating metal fill 240d and 240e between two signal wires 270c and 270f. Capacitive coupling which creates signal interference and reduces signal strength exists between the signal wires 270c and 270f and the metal floating fill 240d and 240e. Shown in FIG. 6b is a conductive fill stripe 215a GND FILL connected to a ground power bus. With the connected conductive fill stripe any coupling between the conductive fill stripe 215a and signal wires 270c and 270f is grounded and the signal routing system becomes more robust.

Figure 7A:
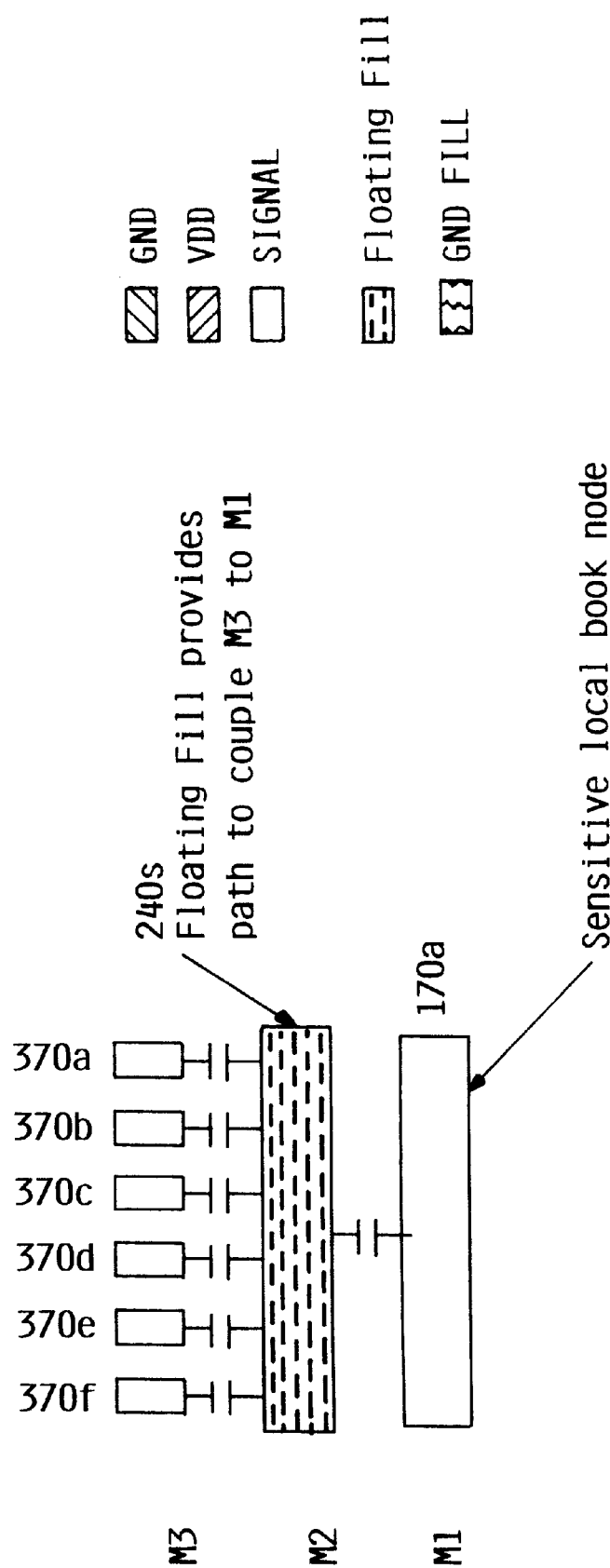
FIGS. 7a and 7b illustrate capacitive coupling between metal layers of the prior art electronic circuit sprinkled with metal fill, and of the electronic circuit using conductive striping in accordance with an embodiment of the invention, respectively.
Figure 7B:
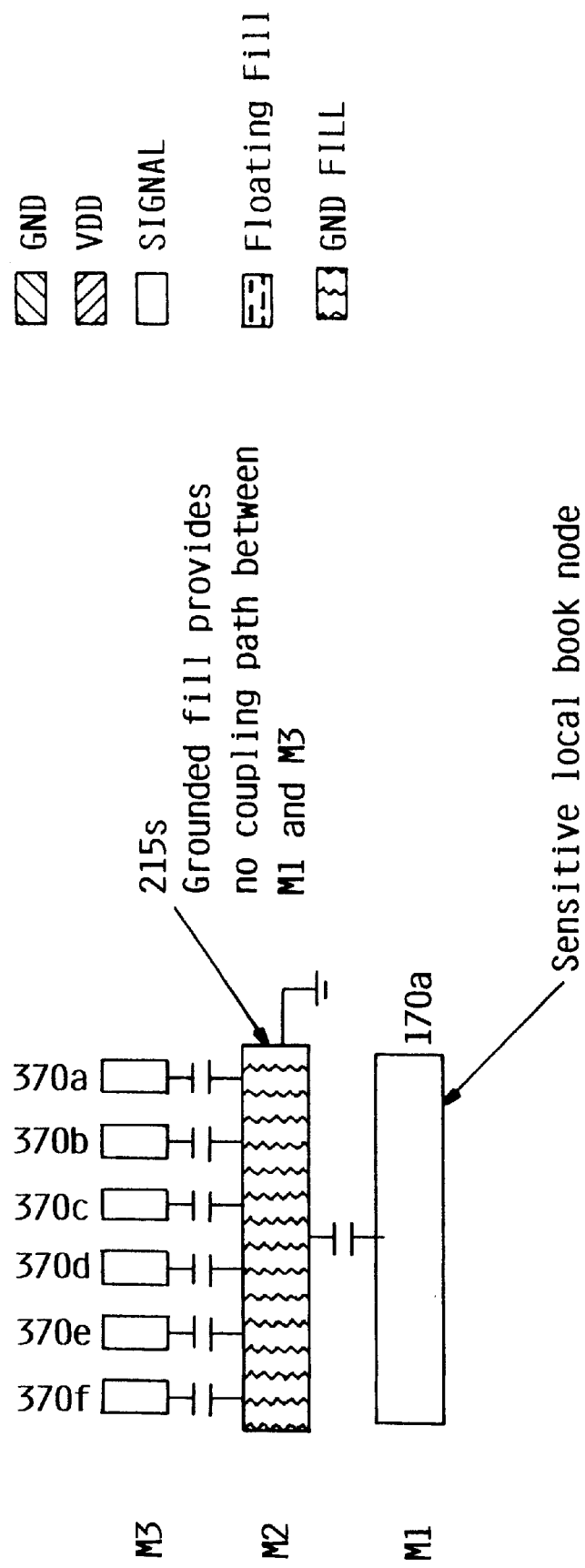

FIGS. 7a and 7b are illustrations of capacitive coupling between metal layer in the prior art using the floating metal fill 250s contrasted with using conductive fill stripe 215s in accordance with one embodiment of the invention. The conductive fill stripe 215s reduces vertical coupling between metal layers. Shown in FIG. 7a is a cross section of three metal layers M1, M2, and M3 vertically displaced from each other. Layer M1 has a signal wire 170a extending horizontally across the figure. Layer M2 in a horizontal plane above M1 and below layer M3 contains floating metal fill 240s of the prior art. Layer M3 has a plurality of signal wires 370a–370f extending in a third dimension in and out of the page perpendicular to layers M1 and M2. In the prior art of FIG. 7a, floating metal fill 240s creates coupling between the signal wire 170a in layer M1 and signal wires 370a–370f of layer M3. Using conductive fill stripes in accordance with principles of the invention, however, actually reduces interplanar coupling. FIG. 7b illustrates three metal layers M1, M2, and M3 in a similar vertical arrangement as in FIG. 7a. Layer M2 between layers M1 and layer M3, however, has a GND FILL conductive power stripe 215s although it could easily be a VDD FILL conductive stripe as well. Any capacitive coupling between the signal wires 370a–370f in metal layer M3 and signal wire 170a in metal layer M1 is grounded because GND FILL conductive power strip 215s is electrically connected to a ground power bus (not shown). In this manner conductive fill stripes enhance signal strength and reduce noisy switching signals.

Figure 8A:
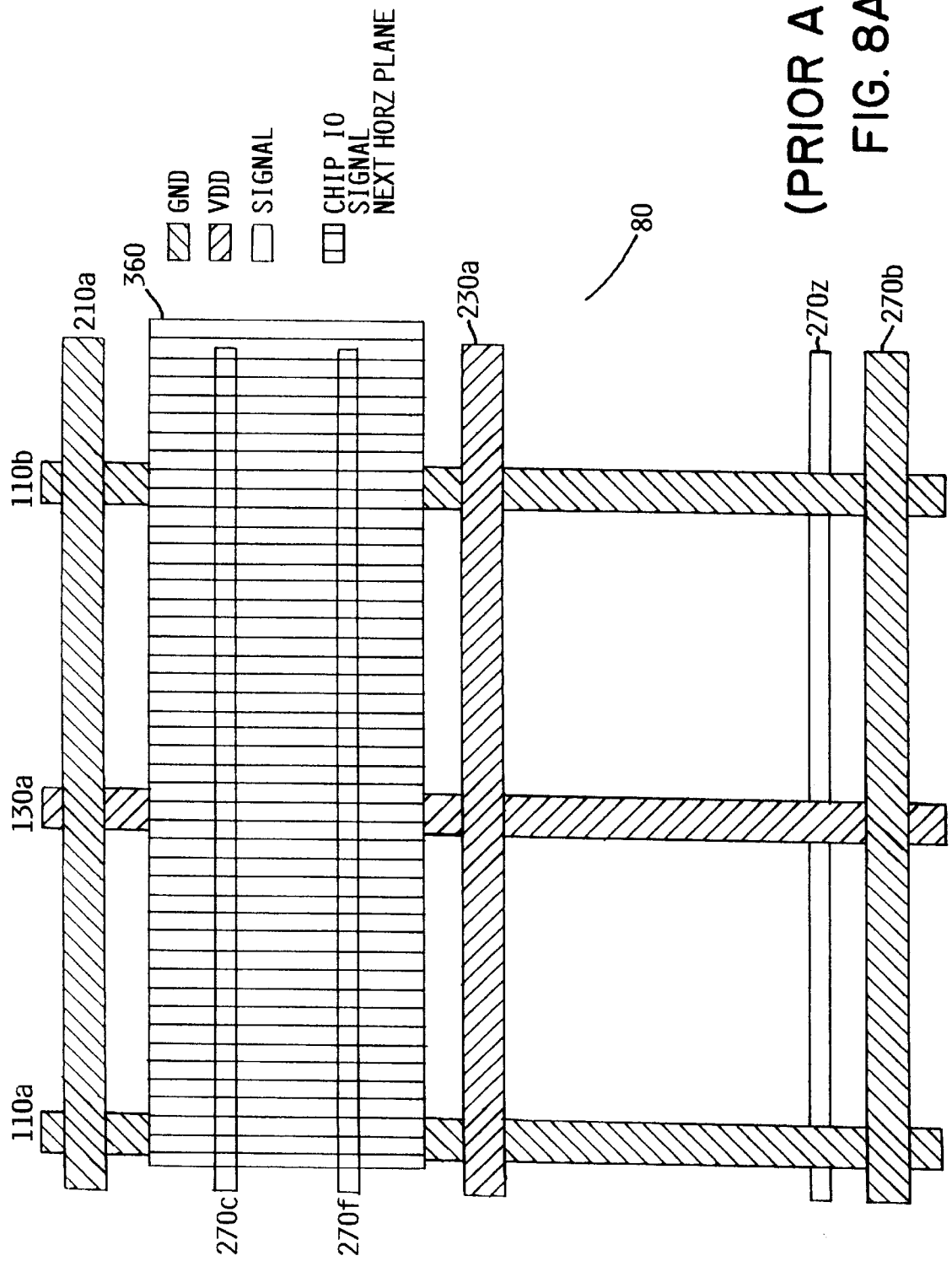
FIGS. 8a and 8b illustrate a horizontal view and a vertical cross section, respectively, of a signal net incorporated into a metal layer of the prior art electronic circuit.
Figure 8B:
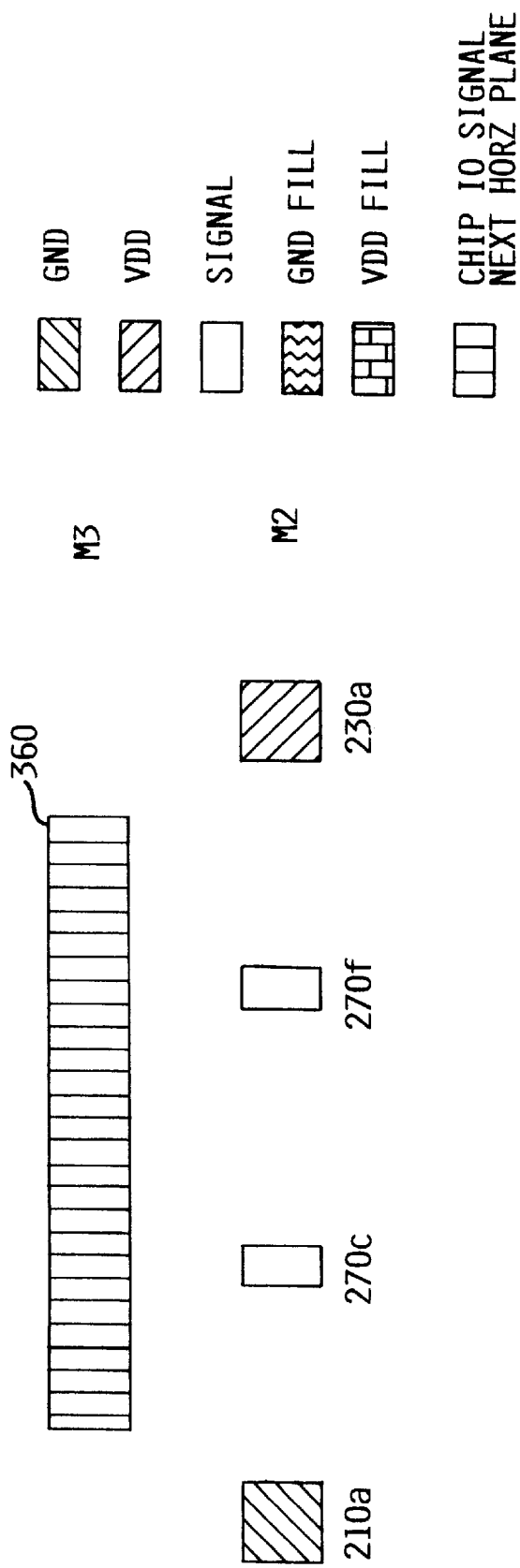

Another benefit of using conductive fill stripes in accordance with principles of the invention is the reduction of signal inductance and inductive coupling. FIG. 8a is a simplified illustration of a prior art large input/output (IO) conductor 360, also called a net, situated on metal layer M3 of an electronic circuit 80. Below, on metal layer M2, ground buses 210a and 210b and bias voltage bus 230a and signal routing conductors 270c, 270f and 270z are situated. On metal layer M1, there exist ground buses 110a, 110b and bias voltage bus 130a perpendicular to the conductors of metal layer M2. FIG. 8b is a vertical cross-section of the arrangement of the upper-half of FIG. 3a when viewed from the left edge of the electronic circuit 80. Metal layer M1 is not shown in FIG. 8b. In the prior art of FIGS. 8a and 8b, both capacitive and inductive coupling exists between the I/O net 360 and the signal conductors 270c and 270f.

Figure 9A:
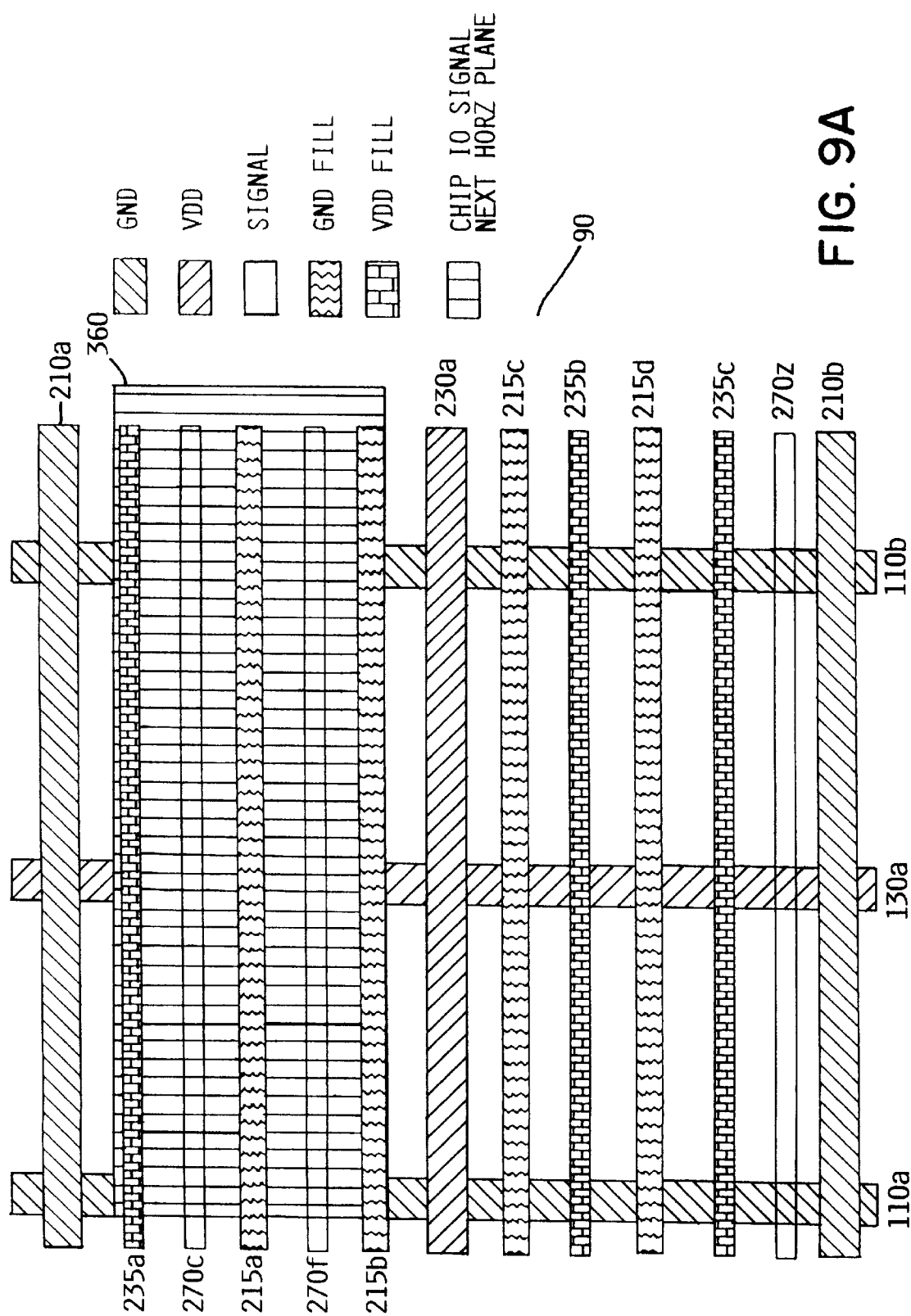
FIGS. 9a and 9b illustrate a horizontal view and a vertical cross section, respectively, of a signal net incorporated in a metal layer of an electronic circuit according to an embodiment of the invention.
Figure 9B:
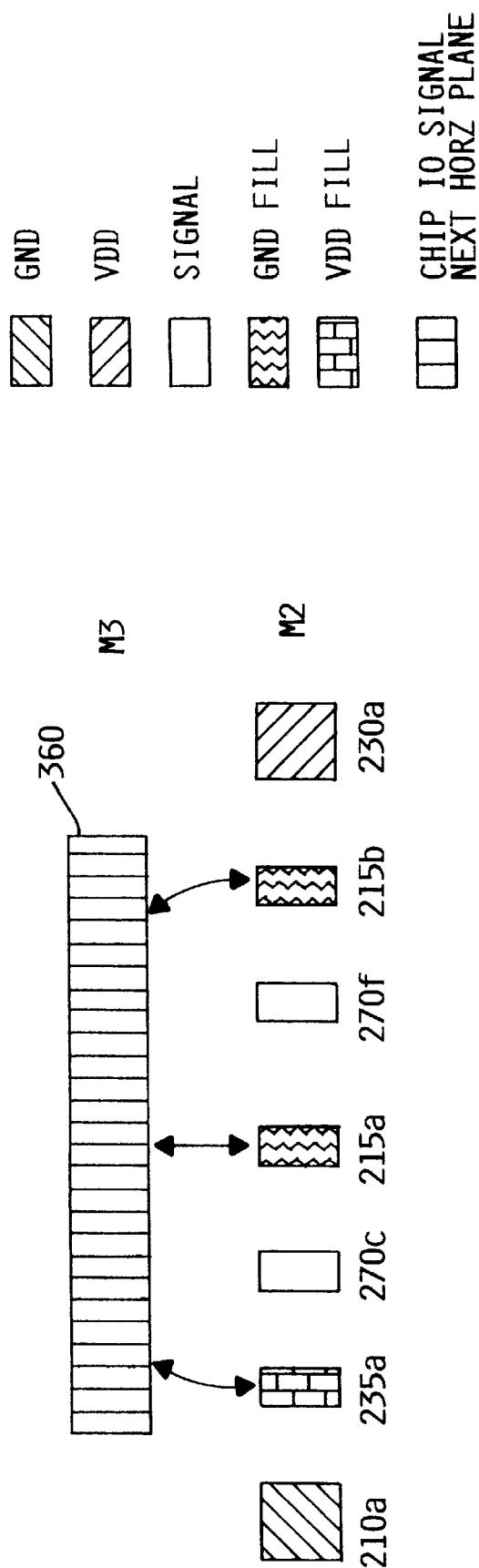

When conductive fill stripes are added in accordance with an embodiment of the invention, as illustrated in FIG. 9a and a similar vertical cross-sectional view of FIG. 8b, inductance and inductive coupling are reduced. FIG. 9a shows the same IO net 360 on metal layer M3. Metal layer M2 now has conductive fill stripes 215a, 215b positioned below (FIG. 9a) and to the right (FIG. 9b) of each signal wire 270c and 270f. Conductive fill stripe 235a is positioned above (FIG. 9a) and to the left (FIG. 9b) of signal wire 270c. Again, the positioning of conductive fill stripes in this particular arrangement is not to be taken as limiting and it could easily have been a different number and conductive fill stripes that had been positioned differently around the signal wires. By adding conductive fill stripes electrically connected to its respective power distribution in accordance with principles of the invention, inductance and inductive coupling are reduced and signal strength and switching speed are enhanced.

While the conductive fill stripes are added to empty metal areas of the chip where the metal density does not meet manufacturing requirements, the conductive fill stripes are normally added so that at least a wiring track gap exists between the conductive fill stripe and a signal wire. This preferred placement limits any impact on active signal line capacitance. The flexibility to define how close or far away the conductive fill stripes are from the signal wires depends on the requirements of the area and signals involved.

It is preferred that the conductive fill stripes be part of the power distribution and thus would be designed into the electronic circuit when the signal routing and the power distribution are designed after an area of the circuit is completed. In this fashion, the impact of including conductive fill stripes into the design can be assessed and necessary changes can be made earlier in the design and manufacturing process. Because the conductive fill stripes are part of the power distribution, moreover, DRC, LVS and extraction tools which generate electrical schematics from the layouts can assess whether the electronic circuit having the conductive fill stripes meet manufacturing density requirements and can detect any potential shorts, and can analyze noise and timing to obtain a more robust electronic circuit.

Figure 10:
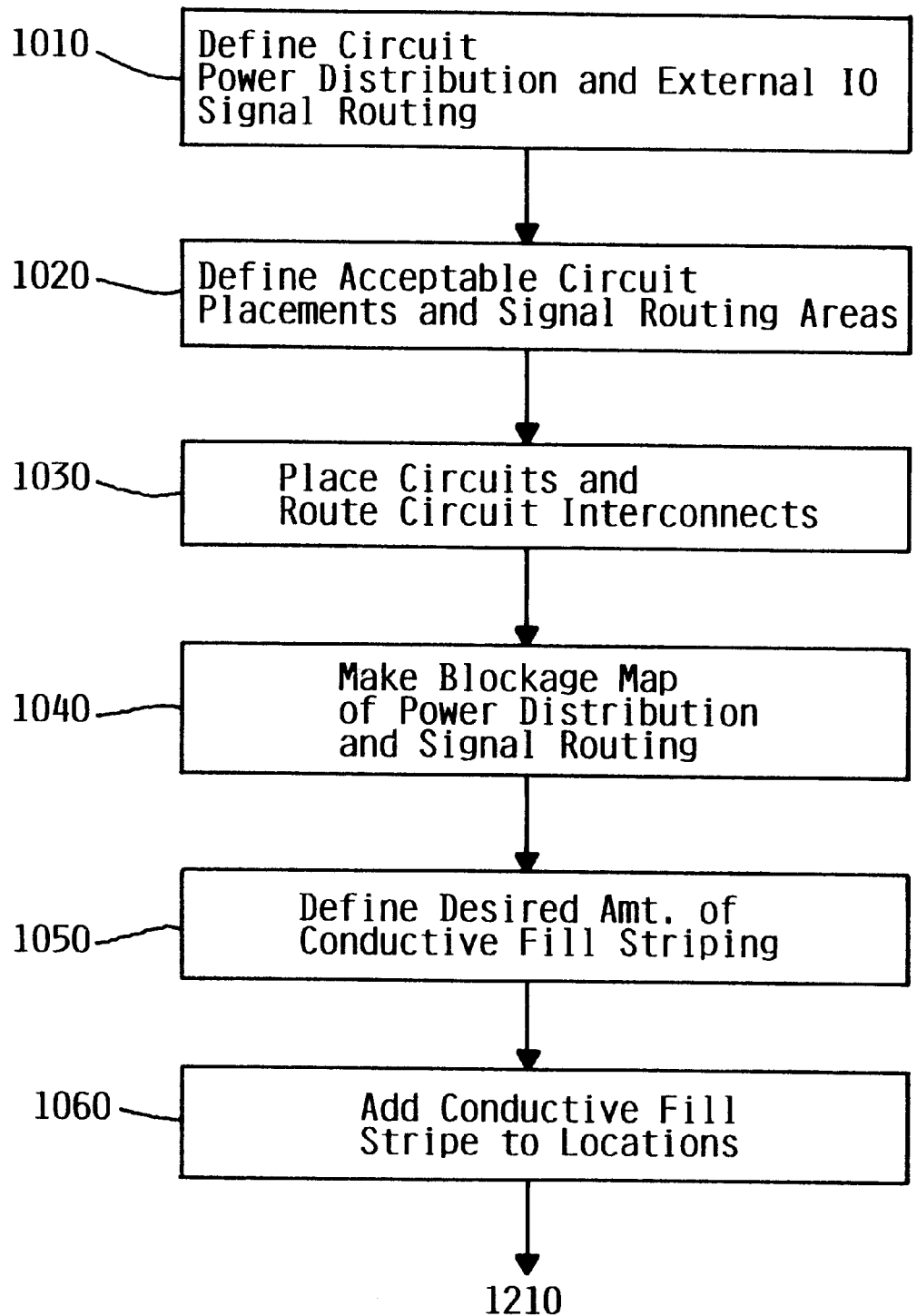
FIG. 10 is a simplified flow chart of a process to incorporate conductive fill stripes into the design of an electronic circuit according to one embodiment of the invention.

FIG. 10 is a simplified flow chart of two options of an embodiment of the invention to add the conductive fill stripes during the design phase of an electronic circuit. Step 1010 begins a process during the design in which the power distribution and external IO signal routing are defined on the integrated circuit image. Then acceptable placements for circuits and the signal routing are set as in step 1020. In step 1030, the electronic circuits and the signal routing and power distribution and interconnections for circuits are placed in the design and in step 1040 a map of the signal routing signal conductors and power distribution for all metal layers is generated. At this time, there exist two options which use the same basic method, as in step 1050, for the placement of conductive fill stripes into the open areas. A first option simply suggests a maximum amount of metal simply be added to open areas or areas missing a signal or power conductor to provide the highest conductor density. This approach, however, may not actually be the best approach and depends on the manufacturing process and the impact of the fill on performance. Some manufacturing processes might produce worse yields or electrical results with maximum fill. Although maximum fill provides a greater predictable capacitance environment, it usually impacts critical timing negatively. A second option of placing conductive fill stripes into an electronic circuit has as its upper bound adding maximum fill as above and as its lower bound adding no fill if the existing spacing meets the design rules. Conductive fill stripes are added to open areas only if a spacing to an adjacent conductor is greater than or equal to the specified spacing variable. Implementing a fill strategy of this sort provides more flexibility to accommodate manufacturing changes as well as the timing goal or other goals of a specific project. At step 1060, conductor fill stripes are added to appropriately determined locations as above and the process continues to step 1210 of FIG. 12.

Figure 11:
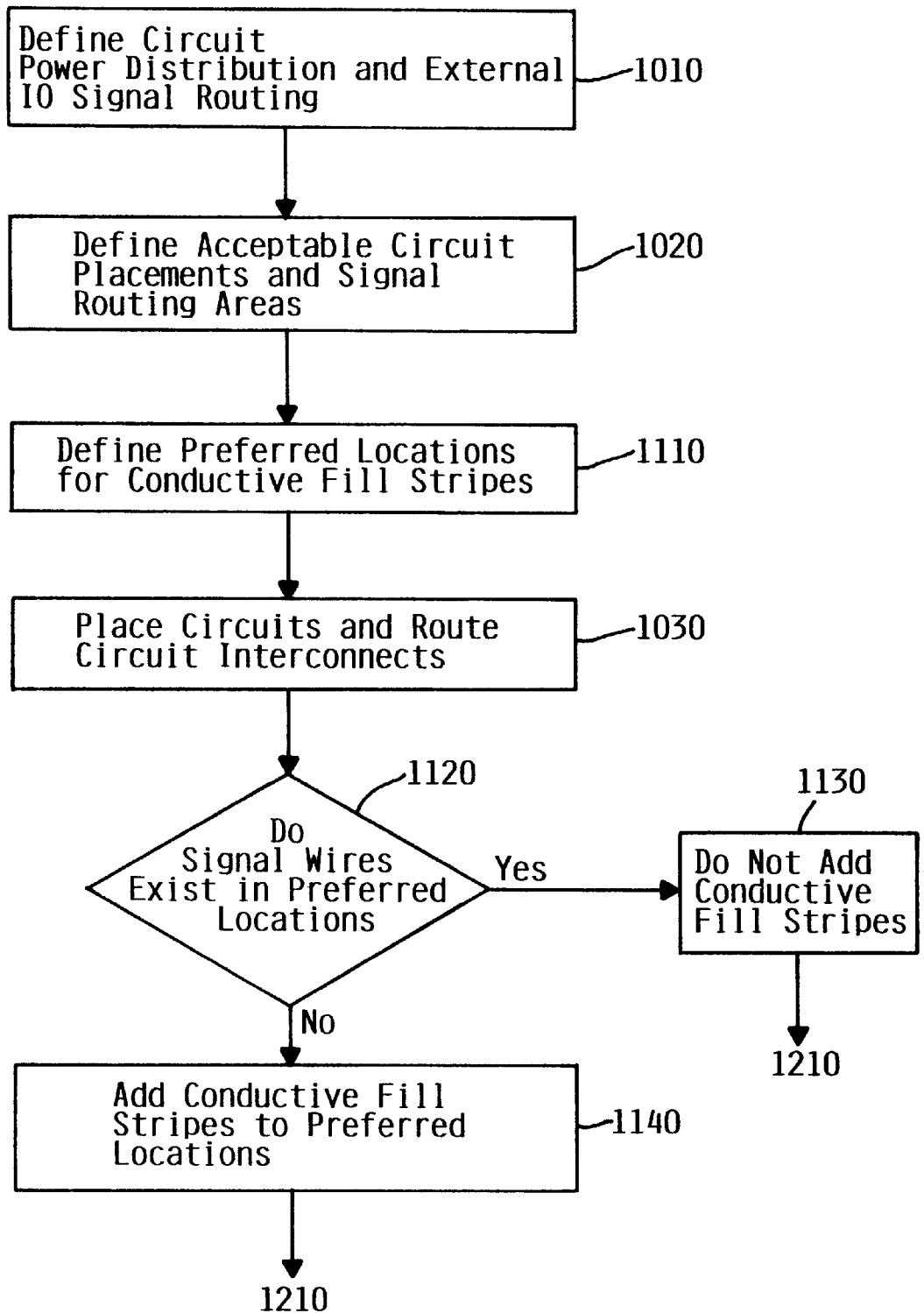
FIG. 11 is a simplified flow chart of a process to incorporate conductive fill stripes into the design of an electronic circuit according to another embodiment of the invention.

FIG. 11 is a simplified flow chart of a third approach to add conductive fill stripes to an electronic circuit. Just as in the previous approaches, the process begins at step 1010 during the design in which the power distribution and signal routing, including IO signal routing, are defined on the integrated circuit image. Then acceptable placements for circuits and the signal routing are set as in step 1020. Now, in step 1110, preferred locations for the placement of conductive fill stripes are defined based on the power distribution. This approach is different from the previous options because rather than just determining if any open areas exist, conductive fill stripes are specifically not added where there are intersections of signal conductors and predefined fill placements. Given the preexisting power distribution and the minimum metal usage requirements, the amount of fill metal is deduced and the potential placement locations for conductive fill stripes are predefined. This approach allows flexibility in the amount of fill and in location of the fill and may in fact be the fastest approach from an overall perspective but requires up-front knowledge of the power distribution and a reasonable understanding of where signal routing is placed. In step 1030 the electronic circuits and the signal routing and power distribution and interconnections for circuits are placed in the design. An inquiry is made at step 1120 to determine if signal wires exist in the preferred locations defined above in step 1110. If signal routing is present in the preferred locations, conductive fill stripes are not added, as in step 1130. If the space is empty, however, conductive fill stripes are added to the preferred locations of the design as in step 1140 and the process advances to step 1210 of FIG. 12.

Figure 12:
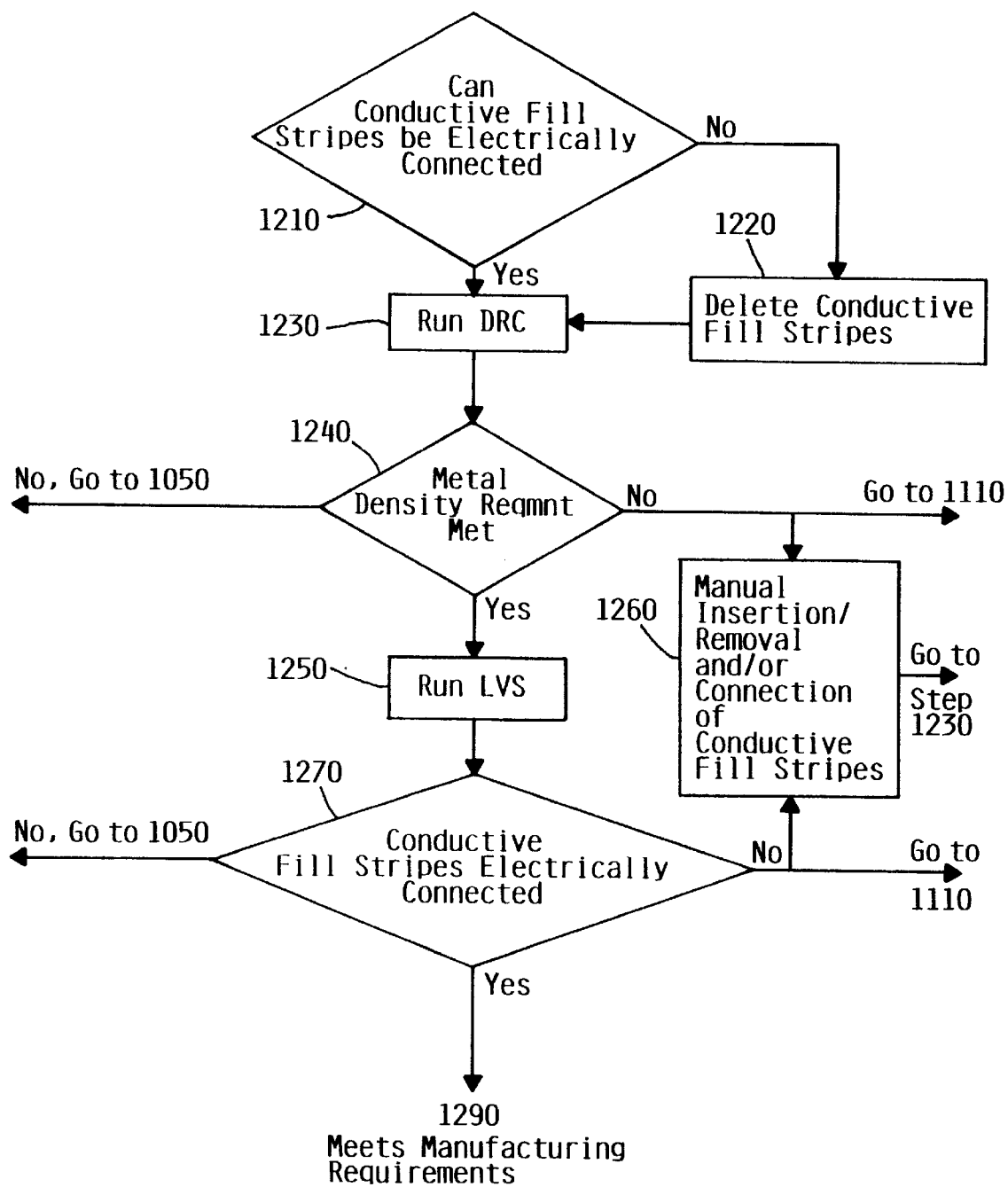
FIG. 12 is a simplified flow chart of a process to verify the placement of conductive fill stripes into the design of an electronic circuit according to principles of the invention.

FIG. 12 then provides a simplified flow chart of the remainder of a process of inserting conductive fill stripes into an electronic design and verifying that the conductive fill stripes are functional. From step 1060 of FIG. 10 and step 1140 of FIG. 11 in which conductive fill stripes have been automatically placed and added to the design of the electronic circuit as determined by the various methods described herein, an inquiry is made at step 1210 to determine if the conductive fill stripes can be electrically connected to the power distribution or the signal routing, as appropriate. If not, as in step 1220, in those areas where electrical connection cannot be made, the conductive fill stripes are deleted from the design. Typically, this is an indication that a particular area has enough conductor to meet manufacturing conductor density requirements. If, however, the conductive power stripes can be electrically attached to the power distribution of the electronic circuit, then the DRC is run in step 1230. In step 1240, an inquiry is made if a particular design rule, i.e., the metal density requirement or the minimum area usage, is satisfied. If not, then the process returns to the design phase, either step 1050 or 1110 of the appropriate option, to determine the placement of additional conductive fill stripes. If, however, the metal density requirement is met, then the LVS is run at step 1270 which confirms that the physical design of the electronic circuit and the logical design of the electronic circuit coincide. Then, at step 1270 the electrical continuity of the conductive fill stripes to the power distribution or the signal routing, as appropriate, are verified to avoid floating shapes. If the process cannot verify that the conductive fill stripes can be electrically connected, then there are two paths. The first action path, is to return to the design phase, either step 1050 or 1110 of the appropriate option, to determine more appropriate placement of conductive fill stripes. A second action is to manually insert, remove, or connect conductive fill stripes into the design of the electronic chip, as in step 1260. Manually, a designer may add conductive fill stripes to areas which do not meet the conductor density requirement as in step 1240. A designer may also remove conductive fill stripes which cannot be electrically attached, as in step 1220. A designer may also manually connect conductive fill stripes to the appropriate power distribution or signal routing. In any event, once a circuit design has been manually modified the circuit must undergo a design rule check as in step 1230.

Then, after it has been determined that electronic circuit design having the conductive fill stripes meet the metal density requirements, pass all the design rules, satisfy the LVS criteria, and that all conductive fill stripes can be electrically attached, it is determined that the circuit design meets the manufacturing requirements as in step 1290.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. An electronic circuit, comprising:
    (a) a plurality of integrated circuits on a wafer;
    (b) a plurality of metal conductive layers electrically connected to said integrated circuits, each of said layers having a distribution network of power and signal conductors with empty areas between said power distribution and said signal conductors; and
    (c) a plurality of conductive fill stripes in said empty areas to meet metal density requirements required for successful operation of said electronic circuit, said conductive fill stripes electrically connected to said distribution network.

2. The electronic circuit of claim 1, wherein said power distribution, said signal conductors, and said conductive fill stripes are copper or an alloy thereof.

3. The electronic circuit of claim 1, wherein said power distribution, said signal conductors, and said conductive fill stripes are titanium or an alloy thereof.

4. The electronic circuit of claim 1, wherein said power distribution, said signal conductors, and said conductive fill stripes are aluminum or an alloy thereof.

5. The electronic circuit of claim 1, wherein said power distribution, said signal conductors, and said conductive fill stripes are gold or an alloy thereof.

6. The electronic circuit of claim 1, wherein said power distribution, said signal conductors, and said conductive fill stripes are tungsten or an alloy thereof.

7. The electronic circuit of claim 1, wherein said conductive fill stripes are positioned between said signal conductors and said power distribution on the same metal conductive layer.

8. The electronic circuit of claim 6, wherein said power distribution further comprises a ground power bus and a bias voltage bus and at least one of said conductive fill stripes is electrically connected to one of said ground power bus or one of said bias voltage bus on an adjacent metal conductive layer.

9. The electronic circuit of claim 7, wherein said conductive fill stripes on a intermediate metal layer comprise a ground fill stripe power and a bias voltage fill stripe; said ground fill stripe electrically connected to a ground power bus on a first metal conductive layer and said bias voltage fill stripe electrically connected to a bias voltage bus on a third metal conductive layer.

10. The electronic circuit of claim 6, further comprising conductive fill stripes electrically connected to said signal routing on an adjacent metal conductive layer.

11. An electronic circuit, comprising:
  (a) a plurality of integrated circuits on a wafer;
  (b) a plurality of metal conductive layers one above another, said conductive layers being electrically connected to said integrated circuits and to each other, each of said metal conductive layers having a distribution network of ground power buses and bias voltage power buses and signal routing with empty areas between said distribution network and said signals conductors; and
  (c) a plurality of conductive fill stripes in said empty areas to meet metal density requirements of said electronic circuit, said conductive fill stripes comprising at least one ground fill stripe parallel to and coextensive with said distribution network of its own metal conductive layer and electrically connected to a ground power bus on a first adjacent metal conductive layer, and at least one bias voltage fill stripe parallel to and coextensive with said distribution network of its own metal conductive layer and electrically connected to a bias voltage power bus on a second adjacent metal conductive layer.

12. A method of designing electronic circuits, comprising the steps of:
  (a) defining power distribution and external IO signal routing of a design of an electronic circuit;
  (b) defining acceptable circuit placements and internal signal routing of said design;
  (c) placing circuits and a plurality of interconnections between said circuits on said design;
  (d) adding a map of said power distribution and said external and internal signal routing onto said design; and
  (e) adding conductive fill striping to portions of said map of said design which do not satisfy metal density requirements.

13. The method of claim 12, wherein said step of adding conductive fill striping to portions of said map of said design which do not satisfy metal density requirements further comprises:
  (f) adding a maximum amount of conductive fill striping to said portions; and
  (g) connecting said conductive fill striping to said power distribution in said design;
  (h) deleting those of said conductive fill striping from said design that cannot be electrically connected to said power distribution;
  (i) running a design rule checker to determine if said design satisfies design rules;
  (j) determining that said design meets metal density requirements and if not, repeating step (e) and continuing;
  (k) if said design meets said metal density requirements are met, then verifying that the logical function of said design matches an electrical schematic of said design; and
  (l) determining that said conductive fill striping can be electrically connected to said power distribution in said design.

14. The method of claim 12, wherein said step of adding conductive fill striping to portions of said map of said design which do not satisfy metal density requirements further comprises:
  (f) adding conductive fill striping to those portions of said design only if a distance to said power distribution or said signal routing is greater than or equal to a specified spacing variable of a design rule; and
  (g) connecting said conductive fill striping to said power distribution in said design;
  (h) deleting those of said conductive fill striping from said design that cannot be electrically connected to said power distribution;
  (i) running a design rule checker to determine if said design satisfies design rules;
  (j) determining that said design satisfies metal density requirements and if not, repeating step (e) and continuing;
  (k) if said design satisfies said metal density requirements then verifying that the logical function of said design matches an electrical schematic of said design; and
  (l) determining that said conductive fill striping can be electrically connected to said power distribution in said design.

15. A method of designing electronic circuits, comprising the steps of:
  (a) defining power distribution and external IO signal routing of a design of an electronic circuit;
  (b) defining acceptable circuit placements and internal signal routing of said design;
  (c) predefining preferred locations in said design for said conductive fill striping based on power distribution and signal strength and switching speed of signal routing;
  (d) placing circuits and a plurality of interconnections between said circuits on said design;
  (e) adding conductive fill striping to said predefine preferred locations lacking signal routing; and
  (f) connecting said conductive fill striping to said power distribution in said design;
  (g) deleting those conductive fill striping from said design that cannot be electrically connected to said power distribution;
  (h) running a design rule checker to determine if said design satisfies design rules;
  (i) determining that said design meets metal density requirements and if not, repeating step (e) and continuing;
  (j) if said design meets said metal density requirements then verifying that the logical function of said design matches an electrical schematic of said design;
  (k) determining that said conductive fill striping can be electrically connected to said power distribution in said design.

* * * * *